United States Patent
Bockleman et al.

(10) Patent No.: US 6,353,649 B1
(45) Date of Patent: Mar. 5, 2002

(54) TIME INTERPOLATING DIRECT DIGITAL SYNTHESIZER

(75) Inventors: David E. Bockleman, Weston; Jui-Kuo Juan, Coral Springs, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/584,980

(22) Filed: Jun. 2, 2000

(51) Int. Cl.$^7$ ................................. H03D 3/24
(52) U.S. Cl. ................. 375/376; 708/271; 327/107
(58) Field of Search ................ 375/376, 371, 375/373; 708/271, 276; 327/129, 107, 105, 136

(56) References Cited

U.S. PATENT DOCUMENTS

| | | | |
|---|---|---|---|
| 4,933,890 A | * 6/1990 | Nuytkens et al. | 708/276 |
| 4,951,237 A | * 8/1990 | Essenwanger | 708/276 |
| 5,053,982 A | * 10/1991 | McCune, Jr. | 708/276 |
| 5,247,469 A | 9/1993 | McCune, Jr. | 364/721 |
| 5,469,479 A | * 11/1995 | Chang et al. | 375/377 |
| 5,905,388 A | * 5/1999 | Valk et al. | 327/107 |

OTHER PUBLICATIONS

Nosaka, H., Nakagawa, T., and Yamagishi A., "A Phase Interpolation Direct Digital Synthesizer with a Digitally Controlled Delay Generator," 1997 Symposium on VLSI Circuits, Digest of Technical Papers No. 4–930813–76–X, pp. 75–76.

* cited by examiner

*Primary Examiner*—Chi Pham
*Assistant Examiner*—Phuong Phu
(74) *Attorney, Agent, or Firm*—Daniel K. Nichols

(57) ABSTRACT

A direct digital synthesizer (200) includes a first accumulator (202) that acts as the frequency accumulator in order to generate the desired average frequency. A second accumulator (204) acts to generate a phase correction at each overflow, with the input into the phase correction accumulator (204) being a function of the input frequency. The clock signal of the phase correction accumulator (204) is the overflow signal (208) of the frequency accumulator (202). With this configuration, the frequency accumulator (202) generates the timing, and the phase correction accumulator (204) generates the interpolation value. The use of the two accumulators (202, 204) as described, eliminates the need to use a multiplier in the design which is a high current consumption device.

12 Claims, 5 Drawing Sheets

TIME INTERPOLATING DIRECT DIGITAL SYNTHESIZER

TECHNICAL FIELD

This invention relates in general to synthesizers, and more particularly to a time interpolating direct digital synthesizer.

BACKGROUND

In a direct digital synthesizer based on digital phase or time correction, such as that shown in FIG. 2, a digital numeric multiplier is typically required. The multiplier is undesirable, especially in portable radio applications, as it dissipates a large fraction of the total power used by the synthesizer. Current best implementations of such a multiplier approach show the multiplier consuming about 40% of the total synthesizer power at maximum output frequency. A need thus exists for a simplified synthesizer that does not need a multiplier, while maintaining full functionality.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
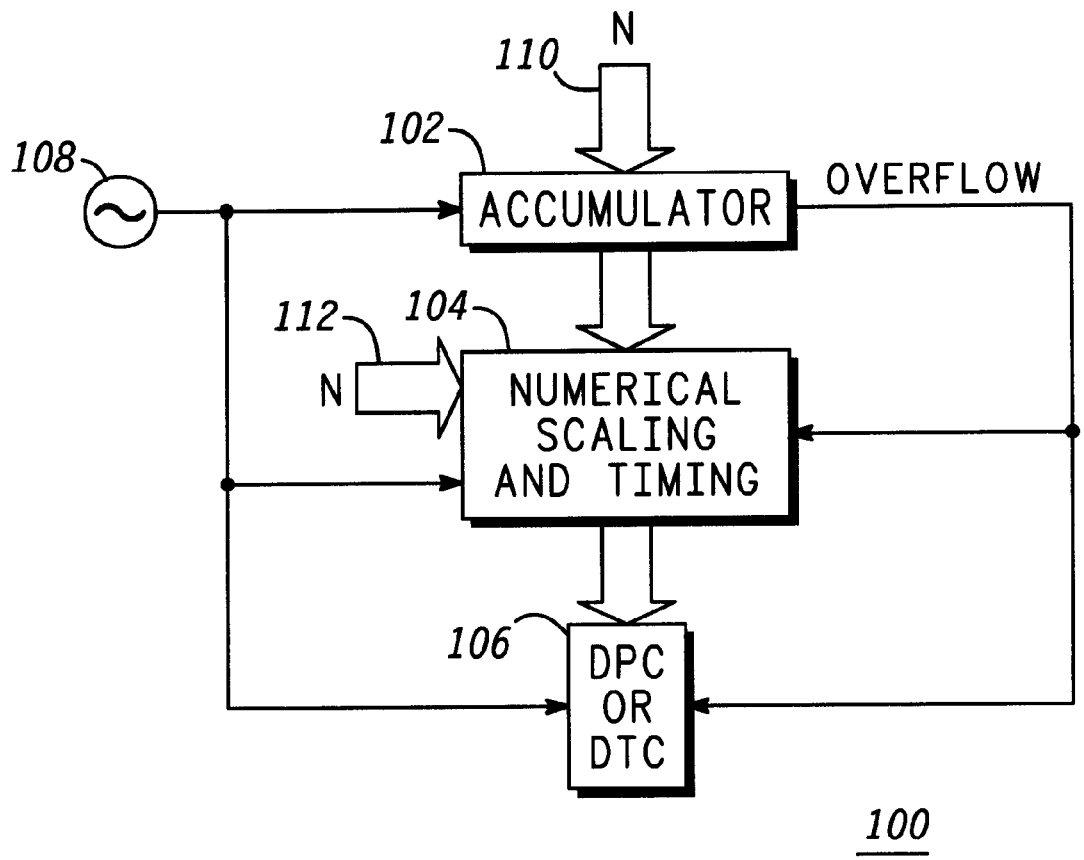
FIG. 1 shows a prior art digital synthesizer.

While the specification concludes with claims defining the features of the invention that are regarded as novel, it is believed that the invention will be better understood from a consideration of the following description in conjunction with the drawing figures, in which like reference numerals are carried forward.

In FIG. 1 there is shown a prior art synthesizer 100. Synthesizer 100 includes an accumulator 102 which has one input for receiving a signal ("N") 110 representative of the required synthesizer output and an input for receiving a reference clock signal 108. The accumulator 102 also includes an overflow output for providing an overflow signal to a numerical scaling and timing block 104 and to a digital phase converter (DPC) or digital time converter (DTC) block 106.

The numerical scaling and timing block 104 takes the content of the accumulator 102 and uses a signal 112 that is N or a function of N to scale it numerically. The numerical scaling and timing block 104 can also deal with signal timing issues. The DPC or DTC block 106 takes the numerical input from the numerical scaling block 104 and then it shifts the phase of the synthesizer's output signal according to that numerical input received. The DPC or DTC 106 can be constructed in a number of different ways as is well known in the art. A particular example of a DPC block is shown in FIG. 2 where synthesizer 200 uses a delay lock loop (DLL) time interpolation block 216.

Figure 2:
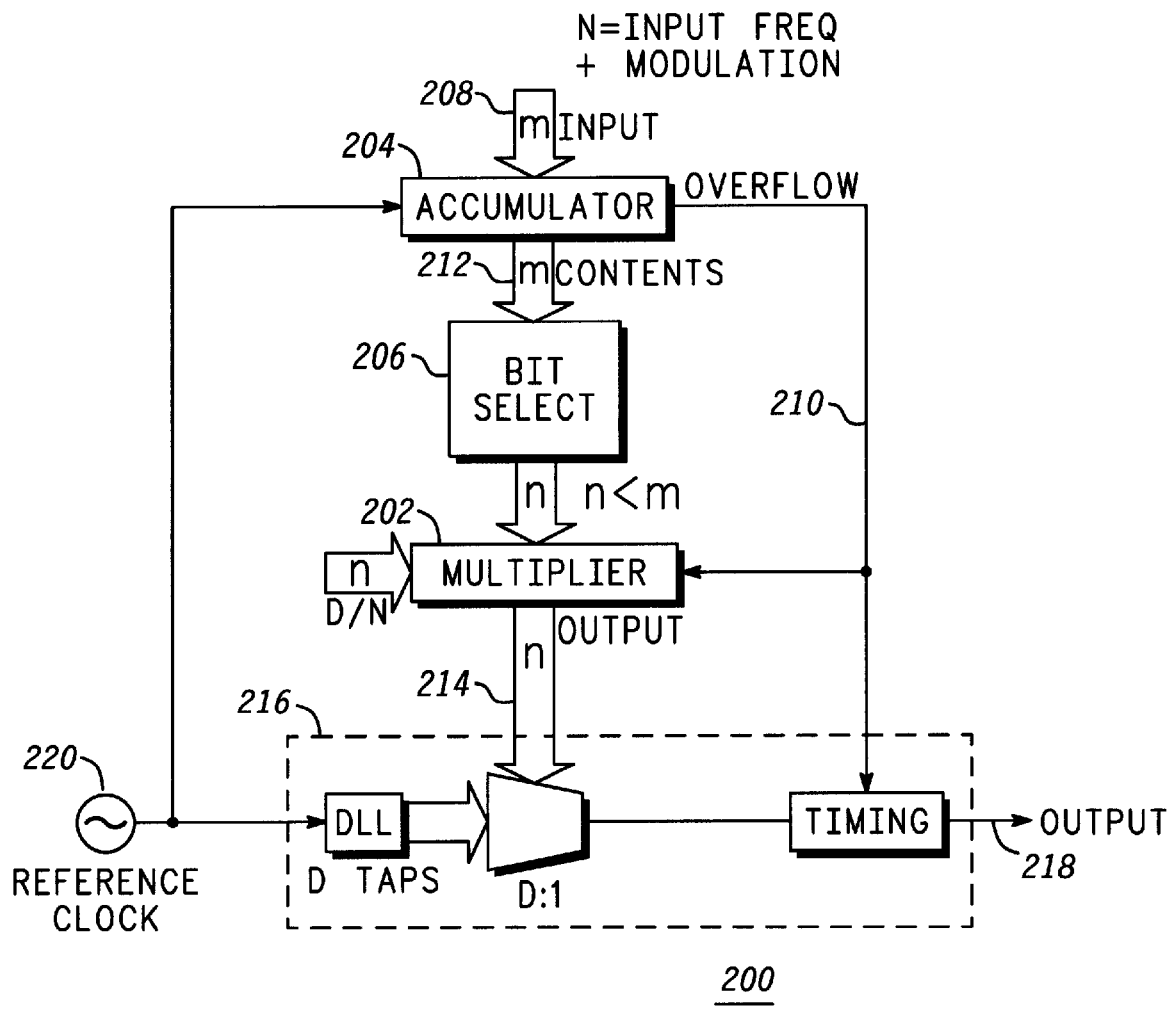
FIG. 2 shows a prior art direct digital synthesizer having a multiplier.

In the prior art synthesizer 200 shown in FIG. 2, a multiplier 202 numerically scales the contents of an accumulator 204 to determine which delay line tap to select. The main problem with synthesizer 200 is that multiplier 202 consumes a large amount of power. This large power consumption is a detriment in portable radio applications where reduction of power requirements is necessary in order to increase the radio's battery life.

Synthesizer 200 includes an accumulator 204 that is a clocked m-bit structure with an "m" wide input bus 208. Accumulator 204 includes a single-bit overflow signal 210 and an m-bit contents bus 212. The input bus 208 receives a frequency select word, which is a representation of the input frequency plus any added modulation that sets the frequency of the output signal provided on output 218. The output signal on output 218 is a single-bit waveform.

A reference clock 220 provides a reference clock signal to the accumulator 204 and to a delay lock loop (DLL), while the multiplier 202 is clocked using the overflow signal 210. A bit selector 206 takes the m-bit wide contents output 212 and provides an n-bit (n<m) wide signal 214, which can take the form of a nominal tap value. The bit selector block 206 is necessary to properly truncate the m-bit wide contents 212 of the frequency accumulator 204 to n-bit wide for the multiplier 202. The n-bit wide signal 214 is provided to a tap selection block 216 which includes the DLL having a total of "D" number of taps.

For accumulator input "N" with value less than or equal to ½ the capacity, "C", of accumulator 204 the average overflow output rate is equal to the output frequency of the synthesizer $f_{out}$. That is $$f_{out} = f_{ref}(N/C).$$

The pulses at the accumulator overflow output 210 are, typically non-uniformly spaced in time. The remaining contents in the accumulator 204 during an overflow cycle can be interpreted as the fraction of a cycle of the output by which the overflow waveform needs to be shifted to produce uniformly spaced pulses. That is, $$\text{change in } t_i = T_{ref}(A_i/N)$$

where the change in $t_i$ is the required time shift for the overflow pulse for clock cycle "i", $T_{ref}$ is the average period of the reference clock waveform, and $A_i$ is the contents of the accumulator on the ith cycle. The DLL is used to generate the delayed output pulse. The delay line has a total of "D" taps, and the total delay through the line is set to a whole number of reference clock periods. This delay can be set by the delay lock loop (DLL) in block 216 as shown, or using other delay structures.

A digital-to-phase converter 216 includes the DLL, a multiplexer that receives the n-bit wide contents of the multipler 202 and a timing block. The digital phase converter 216 provides the synthesizer's output 218. The function of the digital-to-phase converter 216 is to shift the clock pulse applied at its clock input by the time-shift specified at its input port 214. In this context, a full scale value for the n-bit word at the digital-to-phase converter's input 214 is a full cycle phase shift of the reference clock 220. Note that for clock cycles of the reference clock 220 that no accumulator overflow is produced, no output is generated at the digital-to-phase converter output 218.

Figure 3:
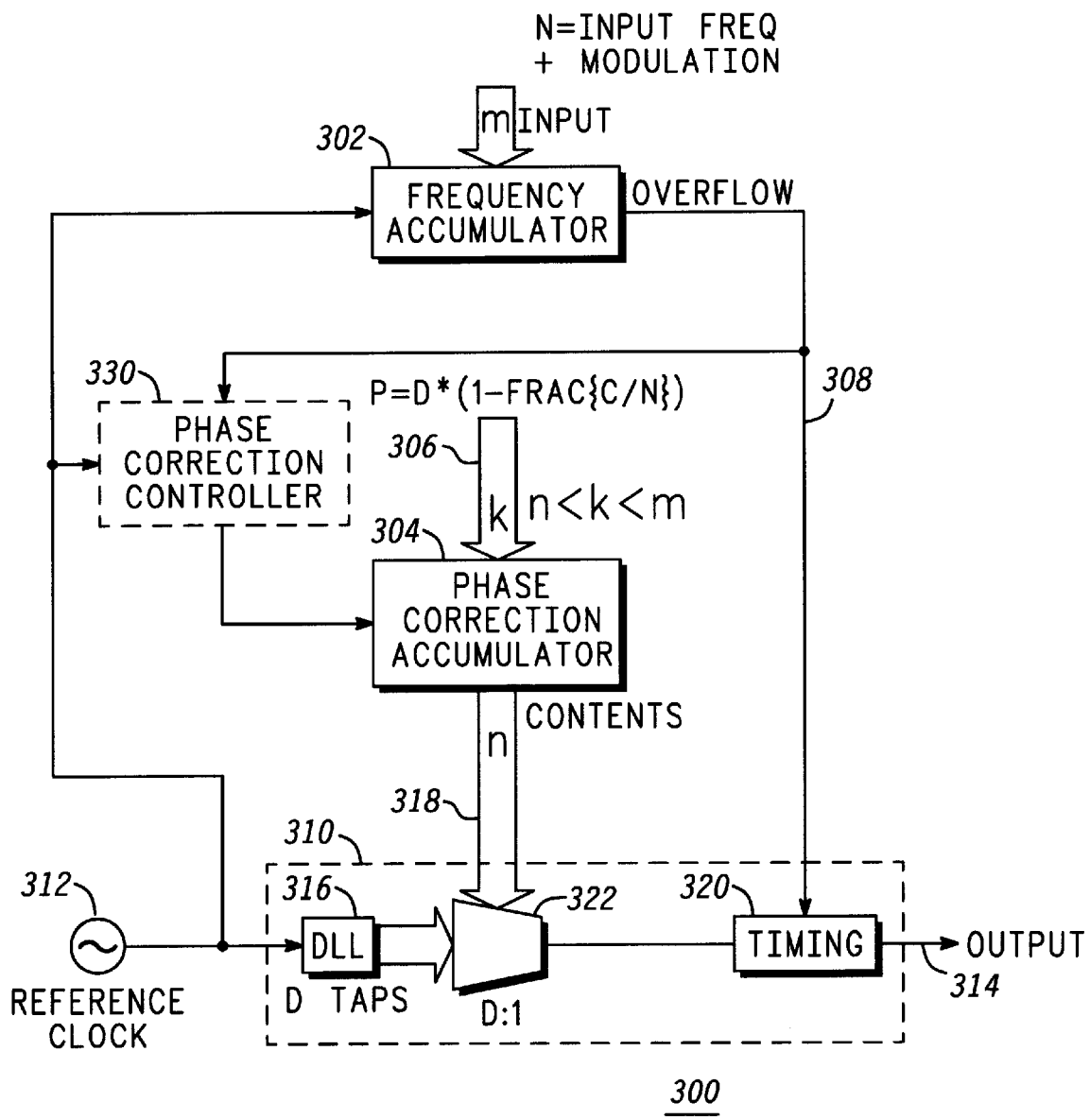
FIG. 3 shows a direct digital synthesizer in accordance with the preferred embodiment.

In FIG. 3, there is shown a synthesizer 300 in accordance with the preferred embodiment. Synthesizer 300 includes a first accumulator 302, which is the same as the accumulator 104 in FIG. 1. First accumulator or frequency accumulator 302 acts to generate the desired average frequency and will be referred to as the frequency accumulator. The frequency accumulator 302 includes an input for receiving a m-bit wide input signal representative of the desired frequency output, "N" (N=input frequency including modulation). The frequency accumulator 302 also includes a clock input and an overflow output 308. For each clock cycle where the accumulator contents exceed the accumulator capacity, an overflow is generated at the accumulator's overflow output 308.

Synthesizer 300 also includes a second accumulator 304 that acts to generate the phase correction required at each overflow condition. The value input or scaled phase correction increment, "P" 306 of the phase correction accumulator 304 is a function of the input frequency: P=D (1-Fraction (C/N)) or appropriate value depending on the digital phase converter, where "C" is the capacity of accumulator 302, "D" is the number of taps in the delay line, "N" is representative of the input frequency and any modulation and "Fraction" is a function that returns the fractional portion of the argument, C/N, and therefore, has a value less than 1 and greater than or equal to zero. The value of "P" may be encoded in any number of ways appropriate to the specific hardware implementation. The bit width of the scaled phase correction increment 306 is "k" which is less than the bit-width "m" of the input "N" into frequency accumulator 302 and greater than the bit-width "n" of the contents 318 sent to multiplexer 322.

The new dual accumulator approach taken by synthesizer 300 works because the residual value in the frequency accumulator 302 upon overflow is a predictable number. In the prior art synthesizer of FIG. 2, this residual value 212 is multiplied by the inverse of the frequency control word "N", since the other input to multiplier 202 is "D/N". The value out of the multiplier 214 is the phase correction term multiplied by the number of taps, "D". The value for "D" can be equal to or greater than 1. The phase correction term or value is a number between 0 and 1, and increases linearly at each overflow, so the output of the multiplier is a number between 0 and D-1. Thus, in accordance with the present invention, if one knows the amount by which the phase correction term increases, then the resultant 214 from the multiplier 202 can be calculated without using a multiplier as is done in FIG. 2. It has been determined that this calculation can be accomplished by adding the phase correction increment to the previous phase correction term.

The phase correction increment can be calculated using the formula: 1-Fraction (C/N), this is the case where D=1 for input "P" 306. Further, it is observed that a second accumulator 304 can act as the block that adds the phase correction increment to the previous phase correction resultant. In this case, the second accumulator 304 stores the previous resultant and automatically accounts for the "wrap around" of the phase correction values by performing modulo 1 addition. The clock of the phase correction accumulator 304 is the overflow signal 308 of the frequency accumulator 302 or a modified version of the overflow signal in the case of use of the optional phase correction control circuit 330. With this configuration, the frequency accumulator 302 generates the timing, and the phase correction accumulator 304 generates the interpolation value or term.

The input clock port of the phase correction accumulator 304 is responsive to the overflow signal 308, either directly or via a modified version of the overflow signal when using circuit 330. The optional phase correction control circuit 330 includes as inputs the reference clock signal and the overflow signal 308 in order to provide a modified signal to the input clock port of phase correction accumulator 304. In its simplest form, the phase correction control circuit 330 can take the form of control hardware that performs a logical function which allows the overflow signal 308 to pass through to the phase correction accumulator 304 if "N" is less than ½ of "C" and act as the clock signal for the accumulator. In the case "N" is equal to or greater than ½ of "C", then the control circuit 330 allows the reference clock signal generated by clock 312 to pass through to the phase correction accumulator 304 allowing for the reference clock signal to act as the clock for accumulator 304. In situations where "N" will always be smaller than ½ of "C" the control circuit 330 is not needed.

In addition, the phase correction accumulator 304 can be made to generate nominal tap numbers (between 0 and D-1) as shown in FIG. 3, rather than phase correction values or terms (between 0 and 1). The tap number represents the selected tap in a tapped delay line. Reference clock 312 provides timing for the frequency accumulator 302 and the DLL 316. With the preferred technique of the present invention, the phase correction increment is pre-multiplied by the number of taps in the delay line. Thus the scaled phase correction increment 306 that is input into phase correction accumulator 304 becomes D(1-Fraction(C/N)). Provided that the phase correction accumulator 304 has enough bits, then the contents 318 (using the appropriate most-significant-bits (MSB's)) will be the correct tap position.

The input number "P" for the phase correction accumulator 304 can be pre-calculated by the controller (e.g., microcontroller, digital signal processor, etc.) of the device (e.g., radio) in which the synthesizer is used, and provided to the synthesizer along with the frequency select word, N. Alternatively, the input number "P" can be calculated by dedicated circuitry.

This dual accumulator architecture further reduces complexity and power consumption by eliminating the need for the bit selector block 206 shown in FIG. 2. The bit selector block in the previous synthesizer architecture is necessary to properly truncate the m-bit contents of the frequency accumulator to n-bits for the multiplier. With the dual accumulator architecture, no such block is required since the "n" most-significant-bits (MSB's) from the phase accumulator 304 are always used. A conventional DPC 310, which in this case uses a variable delay taking the form of a DLL 316, is used. DPC 310 also includes a mutliplexer 322 and appropriate timing block 320.

Figure 4:
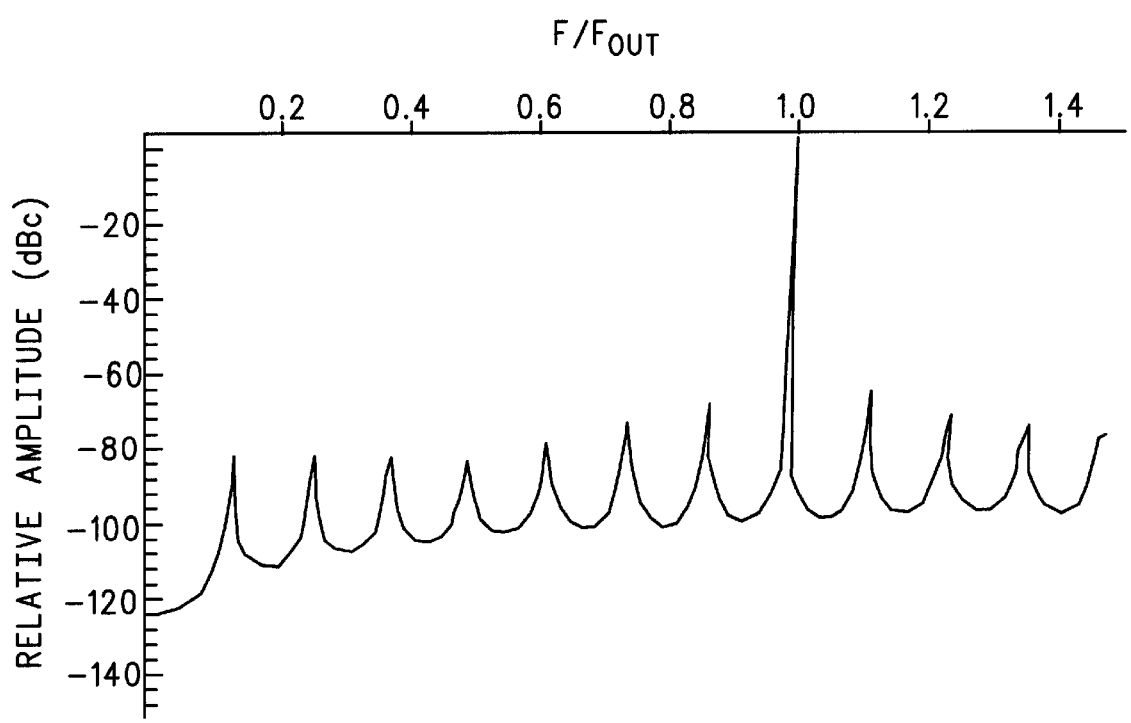
FIG. 4 shows a sample output spectrum of the direct digital synthesizer shown in FIG. 1.

Simulations have shown that the dual accumulator method of FIG. 3 works identically to the multiplier method shown in FIG. 2. FIG. 4 shows the spectrum of the output of the synthesizer 300 with the dual accumulators of the present invention, which is identical to the output spectrum of the synthesizer 200 with multiplexer shown in FIG. 1.

Figure 5:
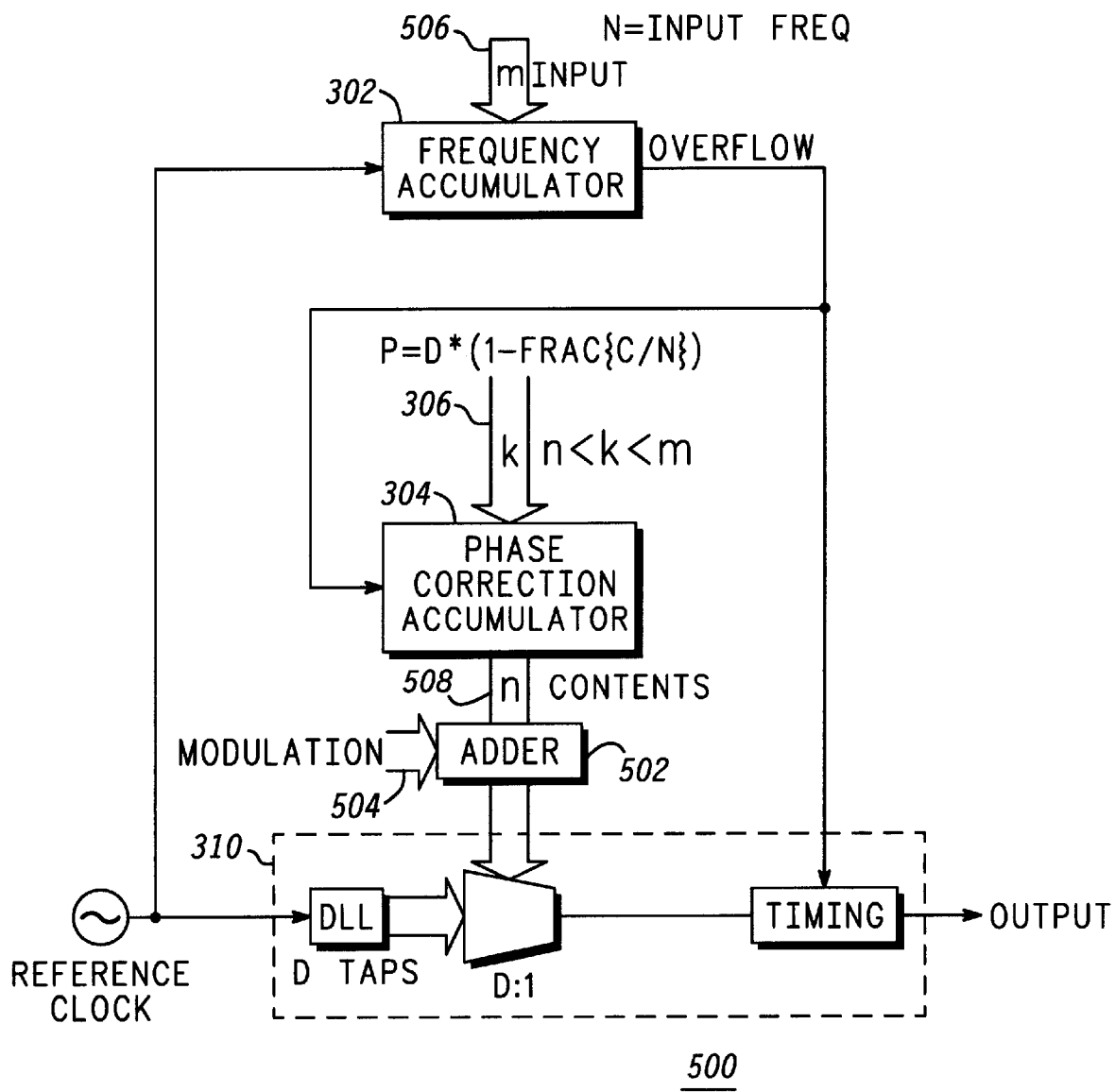
FIG. 5 shows an alternate embodiment of the direct digital synthesizer of the present invention.

Additionally, modulation of the dual accumulator architecture is similar to that of the prior art synthesizer 100. In FIG. 5 there is shown an alternate embodiment of the synthesizer of the present invention including an adder 502 having modulation input 504 for receiving a modulation signal. Note that a modulation signal can be added to the frequency input ("N") 506 using a controller such as a microprocessor or digital signal processor, or added to the phase correction increment number ("P") 306, or added to the resultant as shown, or a combination of the above modulation inputs can be combined. As with FIG. 3, the synthesizer of FIG. 5 can include a phase correction control circuit such as circuit 330.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A synthesizer comprising:

a clock for providing a reference clock signal;

a first accumulator having an input port for receiving a number representative of a desired output frequency, said first accumulator providing an overflow signal; and a second accumulator including an input clock port responsive to said overflow signal, and an input port for receiving a scaled phase correction increment, and an output port providing an output signal representative of a required delay for the reference clock signal.

2. A synthesizer as defined in claim 1, further comprising:

a variable delay responsive to said output signal for delaying the reference clock signal.

3. A synthesizer as defined in claim 1, wherein said output signal delays the reference clock signal in proportion to the value of the output signal.

4. A synthesizer as defined in claim 2, wherein said variable delay comprises a plurality of fixed delay elements.

5. A synthesizer as defined in claim 4, wherein said plurality of fixed delay elements are cascaded together.

6. A synthesizer as defined in claim 1, wherein said input port of the first accumulator receives a modulation signal.

7. A synthesizer comprising:

a clock for providing a reference clock signal;

a first accumulator having an input port for receiving a number representative of a desired output frequency, said first accumulator providing an overflow signal;

a second accumulator including an input clock port responsive to said overflow signal, and an input port for receiving a scaled phase correction increment, and an output port providing an output signal representative of a required delay for the reference clock signal; and a variable delay responsive to said output signal for delaying the reference clock signal;

wherein the scaled phase correction increment is equal to D(1-Fraction(C/N)), where C is equal to the capacity of the first accumulator, D is the number of taps in the variable delay, and N is a value representative of the desired output frequency for the synthesizer.

8. A synthesizer comprising:

a clock for providing a reference clock signal;

a first accumulator having an input port for receiving a number representative of a desired output frequency, said first accumulator providing an overflow signal;

a second accumulator including an input clock port responsive to said overflow signal, and an input port for receiving a scaled phase correction increment, and an output port providing an output signal representative of a required delay for the reference clock signal; and a phase correction control circuit for receiving the overflow signal from the first accumulator and the reference clock signal from the clock, the phase correction control circuit providing the overflow signal to the second accumulator when "N" is less than ½ of "C", where "N" is a value representative of the desired output frequency for the synthesizer and "C" is the capacity of the first accumulator.

9. A synthesizer comprising:

a clock for providing a reference clock signal;

a first accumulator having an input port for receiving a number representative of a desired output frequency, said first accumulator providing an overflow signal;

a second accumulator including an input clock port responsive to said overflow signal, and an input port for receiving a scaled phase correction increment, and an output port providing an output signal representative of a required delay for the reference clock signal; and a phase correction control circuit for receiving the overflow signal from the first accumulator and the reference clock signal from the clock, the phase correction control circuit providing the reference clock signal to the second accumulator when "N" is equal to or greater than ½ of "C", where "N" is a value representative of the desired output frequency for the synthesizer and "C" is the capacity of the first accumulator.

10. A synthesizer comprising:

a clock for providing a reference clock signal;

a first accumulator having an input port for receiving a number representative of a desired output frequency, said first accumulator providing an overflow signal;

a second accumulator including an input clock port responsive to said overflow signal, and an output port providing an output signal representative of a required delay for the reference clock signal, and an input port; and a digital-to-phase converter coupled to the second accumulator having a variable delay and a synthesizer output port;

wherein the second accumulator receives at the input port a scaled phase correction increment equal to D(1-Fraction(C/N)), where C is equal to the capacity of the first accumulator, D is the number of taps in the variable delay, and N is a value representative of the desired output frequency for the synthesizer, and an output port providing an output signal representative of the required delay of the reference clock signal.

11. A synthesizer as defined in claim 10, wherein the digital-to-phase converter includes a delay lock loop (DLL).

12. A synthesizer as defined in claim 11, wherein the DLL comprises a chain of inverters used as tunable delay elements.

* * * * *